(12) United States Patent
Foong et al.

(10) Patent No.: US 7,157,376 B1
(45) Date of Patent: Jan. 2, 2007

(54) METHOD AND APPARATUS FOR HANDLING THIN SEMICONDUCTOR WAFERS

(75) Inventors: Sally Y. L. Foong, Milpitas, CA (US); Lim See-Kee, Penang (MY); Wong Kwet Nam, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/918,395

(22) Filed: Aug. 16, 2004

Related U.S. Application Data

(62) Division of application No. 10/460,164, filed on Jun. 13, 2003, now abandoned.

(51) Int. Cl.
*H01L 21/302* (2006.01)

(52) U.S. Cl. .................. 438/691; 438/459; 438/464; 257/E21.237; 257/E21.484; 29/25.01

(58) Field of Classification Search ............... 438/459, 438/928, 977, 113, 114, 464, 908, 691, FOR. 385, 438/FOR. 485; 257/E21.237, E21.484; 29/25.01
See application file for complete search history.

(56) References Cited

U.S. PATENT DOCUMENTS

| | | | |
|---|---|---|---|
| 5,890,598 A | 4/1999 | Hayashida et al. | |
| 6,092,981 A | 7/2000 | Pfeiffer et al. | |
| 6,499,602 B1 | 12/2002 | Yajima et al. | |
| 6,656,818 B1 * | 12/2003 | Kishimoto | 438/459 |
| 2003/0077854 A1 * | 4/2003 | Teshirogi et al. | 438/113 |
| 2003/0082847 A1 * | 5/2003 | Turner et al. | 438/106 |

* cited by examiner

*Primary Examiner*—George R. Fourson
*Assistant Examiner*—Julio J. Maldonado

(57) ABSTRACT

Cassettes for holding thin semiconductor wafers for safe handling are provided, along with an improved methodology for reducing the thickness of semiconductor wafers. Embodiments include a cassette for holding thin semiconductor wafers, having a plurality of sets of center and edge supports, the sets being spaced from each other a distance greater than a sag amount of the wafers. The thin wafers are supported in a predetermined reference plane, so that tools such as robots or automatic handlers can be programmed to pick them up without damaging them. In another embodiment, a double into single pitch wafer cassette is provided having a wafer entrance section with spacing twice as large between sets of edge supports as a conventional cassette, to accommodate the sag/warp of the thin wafers, and a "flattening section" which guides and flattens the wafers between opposing edge supports as they are pushed into the cassette, such that the wafers are held substantially planar. Because the wafers are held substantially planar, they can be safely removed from the cassette by automatic tools. A methodology is also provided for reducing the thickness of a semiconductor wafer, comprising grinding the back side of the wafer to reduce its initial thickness to an intermediate thickness, and plasma etching the back side of the wafer to reduce the intermediate thickness to a final thickness. The two-step grinding/etching process is faster and less expensive than conventional multi-step grinding/polishing processes, because it requires less steps, each step is accomplished relatively quickly, and it employs standard grinding and etching equipment, rather than expensive dedicated equipment.

6 Claims, 5 Drawing Sheets

METHOD AND APPARATUS FOR HANDLING THIN SEMICONDUCTOR WAFERS

RELATED APPLICATION

This application is a Divisional of U.S. patent application Ser. No. 10/460,164, filed Jun. 13, 2003, now abandoned.

FIELD OF THE INVENTION

The present invention relates to the handling of semiconductor wafers for making semiconductor devices. The present invention has particular applicability in handling thin wafers which are not rigid.

BACKGROUND ART

Conventional techniques for handling semiconductor wafers (such as silicon wafers) during processing, and in particular for transferring wafers between processing tools, typically involve standard-sized cassettes which hold a plurality of wafers at a time; e.g., about 14 wafers to a cassette. The wafers are typically supported by their edges by "fins" protruding inward from the sides of the cassettes. Handling chucks or "forks" associated with robotic and/or automatic equipment are used to remove wafers from the cassettes one at a time by supporting the wafer from the bottom, inboard of the cassette fins. The forks bring the wafers to and from processing equipment, and place the wafers into the cassettes.

The above-described handling techniques were developed for wafers that are substantially rigid, such as wafers having a thickness of about 250 µm or greater. However, recently developed device packaging schemes; e.g., "chip-sized packages" used in miniaturized products such as cell phones, are significantly smaller than conventional packages, and require thinner semiconductor devices. Therefore, thin silicon wafers are currently being produced, having a thickness of about 150 µm or less. These thin wafers, which can have a diameter of 8 inches (200 mm) and a thickness of only 100 µm, typically start processing being much thicker (e.g. about 500 µm thick) and are ground from their back side ("back ground") to a desired final thickness.

Conventional wafer backgrinding is typically performed in many steps using an integrated, dedicated progressive grinder/polisher. Such machinery is very expensive, and is only as fast as its slowest component. Therefore, backgrinding is a "bottleneck" in wafer processing, reducing throughput and raising production costs.

A further disadvantage of conventional processes is that thin semiconductor wafers tend to warp and sag after backgrinding, due to backgrinding induced stresses and other mechanical stresses. When placed in conventional wafer cassettes, the sagging thin wafers touch each other. Moreover, when a fork attempts to remove a sagging and/or warped wafer from the cassette, the fork can easily hit the wafer and scratch or otherwise damage it, since the wafer is not within the "reference window" of a predetermined reference plane. In other words, the wafer is not where the fork expects it to be, because the warped and/or sagging wafer is not located in a predictable "work plane". Thus, the fork cannot safely handle the thin wafer.

There exists a need for a cost-effective, less time-consuming technique for thinning wafers. There also exists a need for a method and apparatus for handling thin wafers without damaging them, thereby reducing manufacturing costs and increasing yield.

SUMMARY OF THE INVENTION

An advantage of the present invention is a method and apparatus for safely handling thin semiconductor wafers. Another advantage of the present invention is a technique for reducing wafer thickness which is cost-effective and flexible.

According to the present invention, the foregoing and other advantages are achieved in part by a cassette for holding a thin semiconductor wafer, the cassette comprising a center support and a pair of opposed edge supports for supporting the wafer such that the wafer is substantially planar.

Another aspect of the present invention is a cassette for holding a thin semiconductor wafer, the cassette having a pair of opposed edge supports, each edge support comprising a substantially planar first part and a second part. The second part comprises a flattening section, substantially parallel to the first part and spaced from the first part to form a first gap between the first part and the flattening section. The flattening section is for cooperating with the first part to support the wafer such that the wafer is substantially planar. A wafer guiding section cooperates with the first part to guide the wafer into the first gap as the wafer is inserted into the cassette.

A still further aspect of the present invention is a method of reducing the thickness of a semiconductor wafer having an initial thickness, the method comprising grinding a back side of the wafer to reduce the initial thickness to an intermediate thickness, and plasma etching the back side of the wafer to reduce the intermediate thickness to a final thickness.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
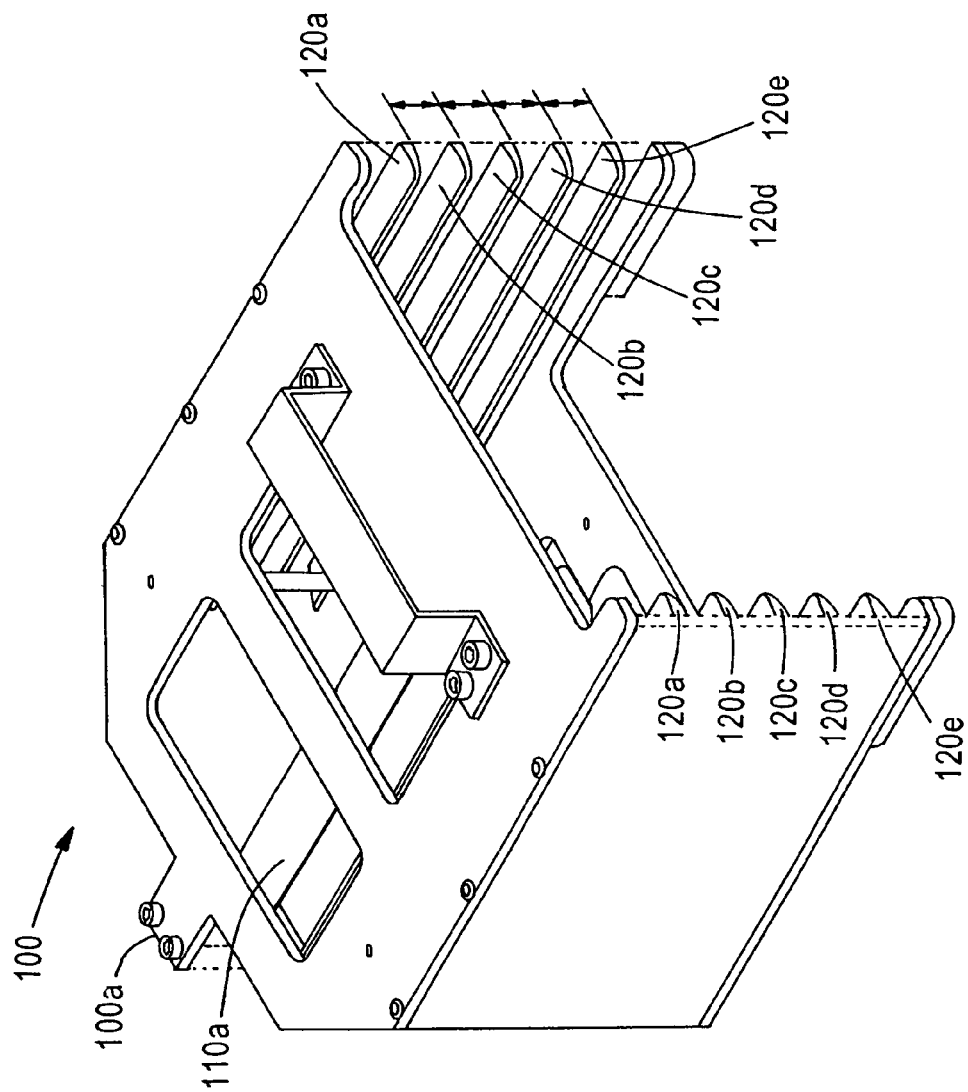
FIG. 1A is a perspective view of a wafer cassette according to an embodiment of the present invention.

Conventional methodologies for thinning semiconductor wafers are time-consuming, and require expensive dedicated equipment, which increases the cost of the finished device and reduces manufacturing throughput. Conventional methods for handling thin wafers result in damage to the wafers, reducing yield. The present invention addresses and solves these problems stemming from conventional manufacturing processes.

According to the present invention, a cassette for holding thin semiconductor wafers has a center support and a pair of edge supports for supporting the wafer in a predetermined reference plane, so that tools such as robots or automatic handlers can be programmed to pick them up without damaging them. As used throughout the present disclosure and claims, the term "wafer" denotes a semiconductor wafer, such as a silicon wafer. The inventive cassettes each have a plurality of sets of center and edge supports, the sets being spaced from each other a distance greater than a sag amount of the wafers.

In another embodiment of the present invention, a double into single pitch wafer cassette is provided having a wafer entrance section with spacing twice as large between sets of edge supports as a conventional cassette, to accommodate the sag/warp of the thin wafers, and a "flattening section" which guides and flattens the wafers between opposing edge supports as they are pushed into the cassette, such that the wafers are held substantially planar. Because the wafers are held substantially planar, they can be safely removed from the cassette by automatic tools.

The present invention also provides a methodology for reducing the thickness of a semiconductor wafer, comprising grinding the back side of the wafer to reduce its initial thickness to an intermediate thickness, and plasma etching the back side of the wafer to reduce the intermediate thickness to a final thickness. The inventive two-step process is faster and less expensive than conventional multi-step grinding/polishing processes, because it requires less steps, each step is accomplished relatively quickly, and it employs standard grinding and etching equipment, rather than expensive dedicated equipment.

An embodiment of the present invention will now be described with reference to FIGS. 1A and 1B. A cassette 100 according to this embodiment of the present invention is for supporting a thin wafer in a predetermined reference plane, so that tools such as robots or automatic handlers can be programmed to pick them up without damaging them. Cassette 100 for holding a thin semiconductor wafer (not shown) comprises a plurality of sets of wafer supports, each set comprising a center support 110a–e, best seen in FIG. 1B, and a pair of opposed edge supports 120a–e, for supporting the wafer such that the wafer is substantially planar. For example, center supports 110a–e can have a width $W_1$ of about 25 mm, and edge supports 120a–e can have a width $W_2$ of about 15 mm to support a thin wafer having a diameter of about 190 mm. Each center support 120a–e extends from a rear portion 100a of cassette 100 towards a central interior portion of cassette 100; for example, to at least the center of the wafer. Each center support 110a–e is a substantially flat plate. Cassette 100 and center supports 110a–e can comprise aluminum or a plastic material.

Figure 1B:
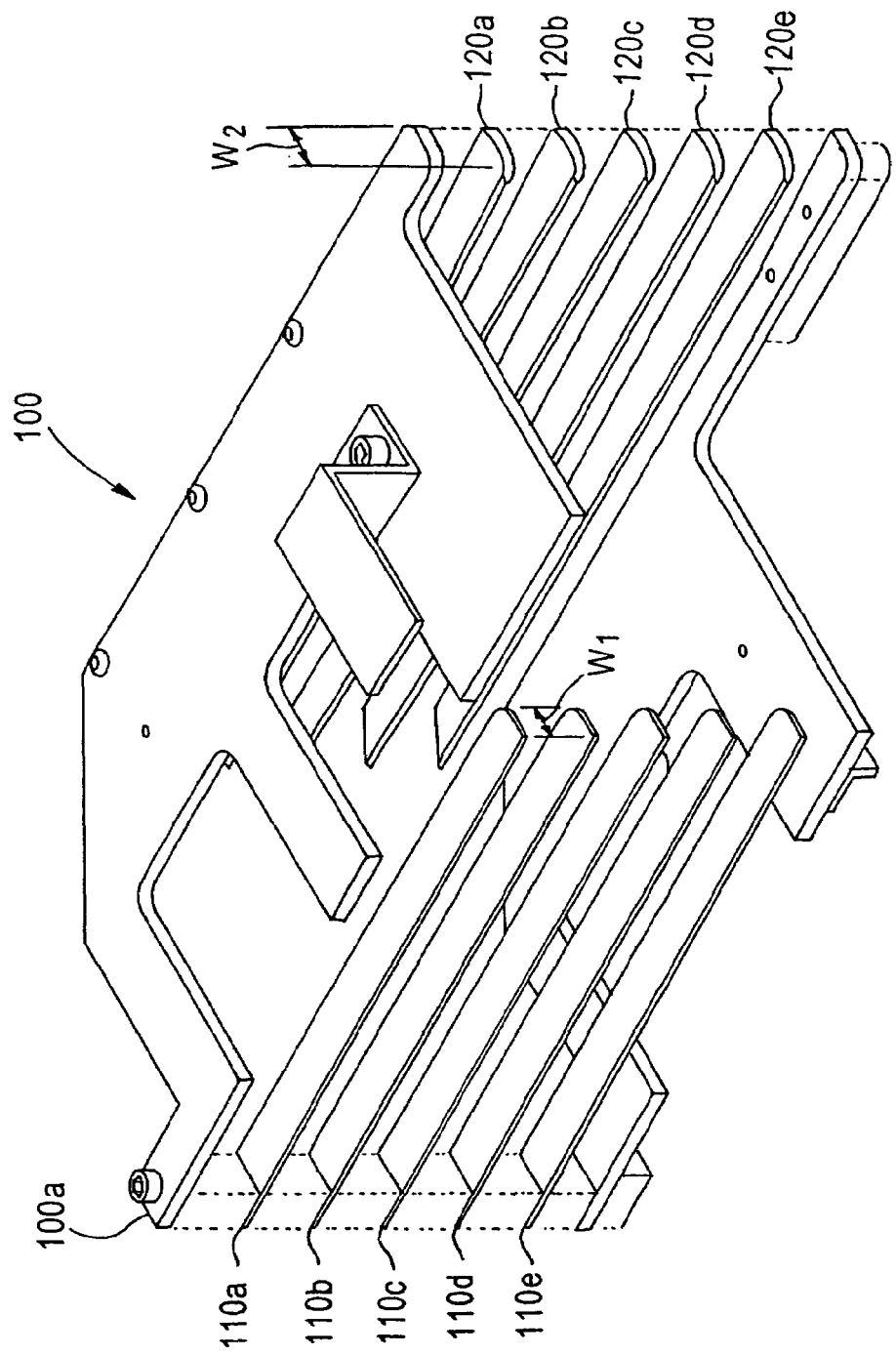
FIG. 1B is a cutaway perspective view of the wafer cassette according to the embodiment of the present invention shown in FIG. 1A.

As shown in FIG. 1A, a space S exists between the sets of wafer supports. Space S is determined by the expected maximum sag amount of the wafer; that is, space S is greater than the sag amount. For example, S can be about 14 mm for a wafer having a diameter of about 190 mm. Each center support 110a–e and pair of edge supports 120a–e support a wafer such that the wafer is located approximately in a reference plane (e.g., a plane including a center support 110a and a pair of edge supports 120a) for the wafer to be picked up and removed from the cassette by a transport arm (not shown).

Figure 2A:
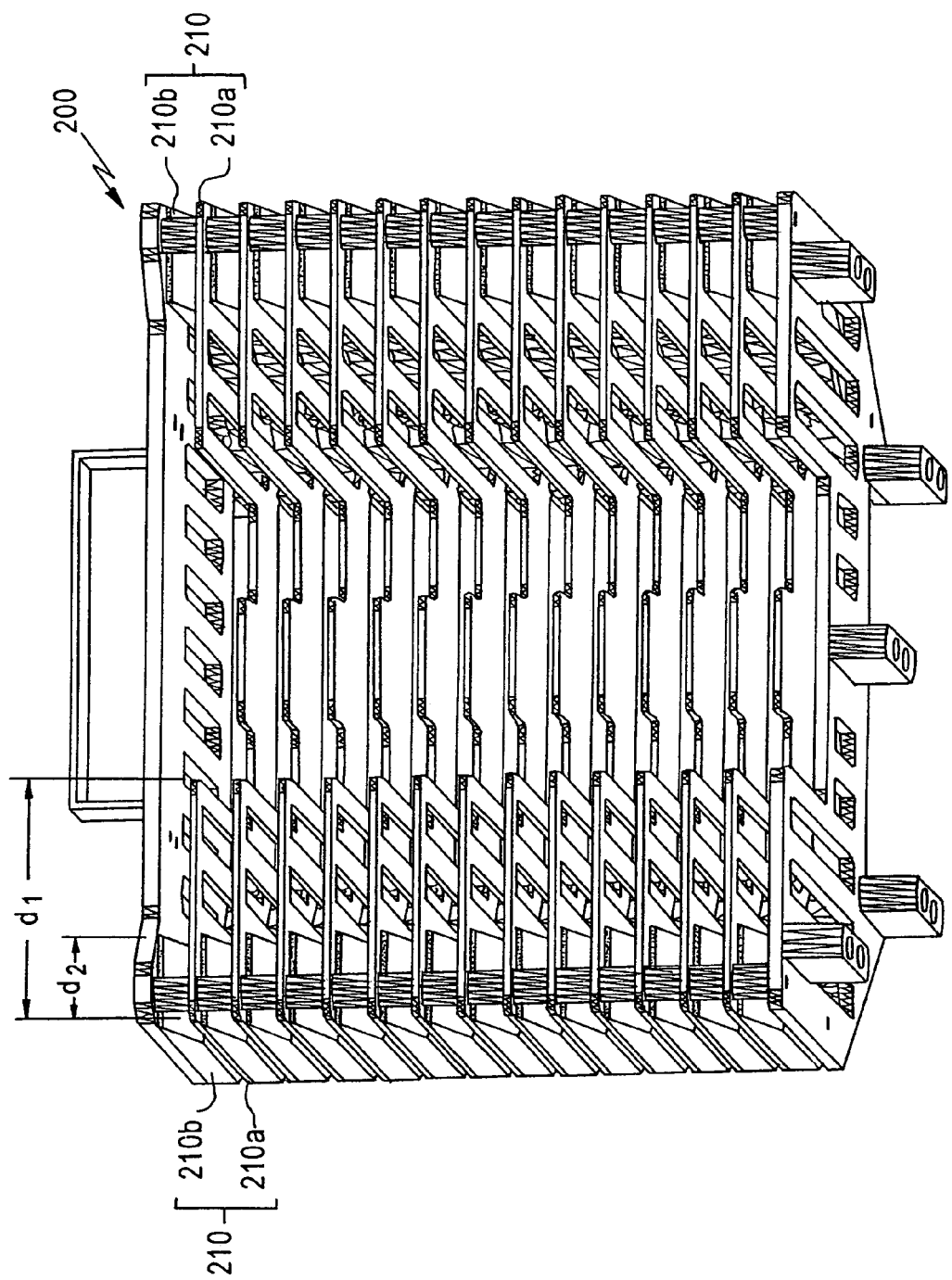
FIG. 2A is a perspective view of a wafer cassette according to another embodiment of the present invention.
Figure 2B:
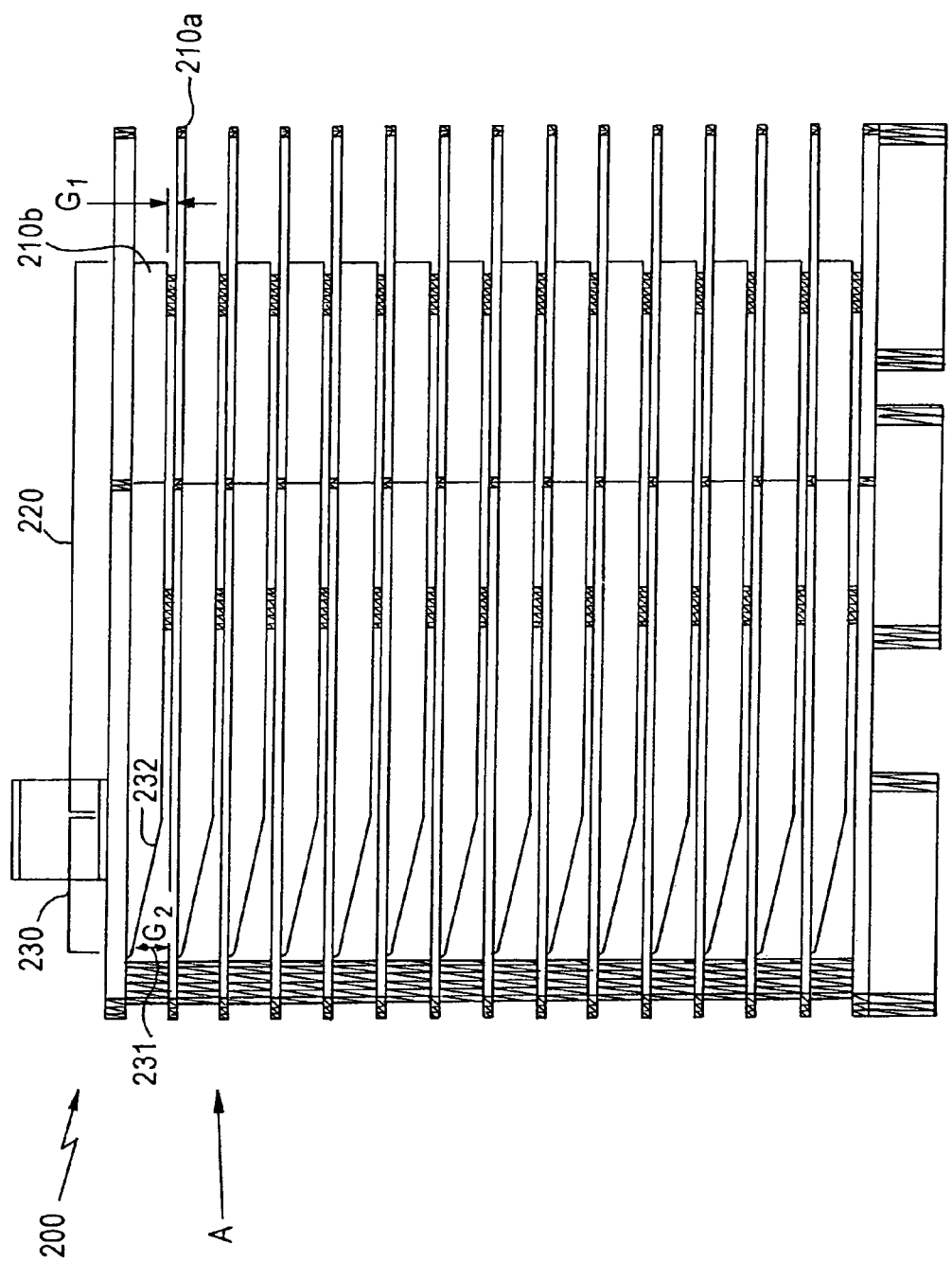
FIG. 2B is a side view of the wafer cassette according to the embodiment of the present invention shown in FIG. 2A.

Another embodiment of the present invention will now be described with reference to FIGS. 2A and 2B. In this embodiment of the present invention, a cassette 200 for holding a thin semiconductor wafer (not shown) has a wafer entrance section with spacing larger (e.g., at least twice as large) between sets of edge supports than a conventional cassette, to accommodate the sag/warp of the thin wafers, and a "flattening section" which guides and flattens the wafers between opposing edge supports as they are pushed into the cassette. Thus, the wafers are held substantially planar, and can be safely removed from the cassette by automatic tools. Cassette 200 has a plurality of pairs of opposed edge supports 210, each edge support 210 comprising a substantially planar first part 210a and a second part 210b. As shown in FIG. 2B, second part 210b comprises a flattening section 220, which is substantially parallel to first part 210a and spaced from first part 210a to form a first gap G1 between first part 210a and flattening section 220. Flattening section 220 is for cooperating with first part 210a to support the wafer such that the wafer is substantially planar.

Second part 210b further comprises a wafer guiding section 230 for cooperating with first part 210a to guide the wafer into first gap G1 as the wafer is inserted into cassette 200. Wafer guiding section 230 has an entrance portion 231 spaced from first part 210a to form a second gap G2 larger than first gap G1 (e.g., at least twice as large as G1), and a tapering portion 232 extending from entrance portion 231 to flattening section 220. Thus, as the warped and/or sagging wafer is pushed into entrance portion 231 in the direction of arrow A, tapering portion 232 cooperates with the planar first part 210a to progressively flatten the wafer without damaging it, thereby guiding it into first gap G1.

Referring again to FIG. 2A, first part 210a extends towards the center of the wafer a first distance d1, and wafer flattening section 220 of second part 210b extends toward the center of the wafer a second distance d2, which is less than first distance d1.

A methodology for reducing the thickness of a semiconductor wafer according to the present invention will now be described with reference to the flow chart of FIG. 3. The inventive method comprises grinding the back side of the wafer to reduce its initial thickness to an intermediate thickness, and plasma etching the back side of the wafer to reduce the intermediate thickness to a final thickness.

Figure 3:
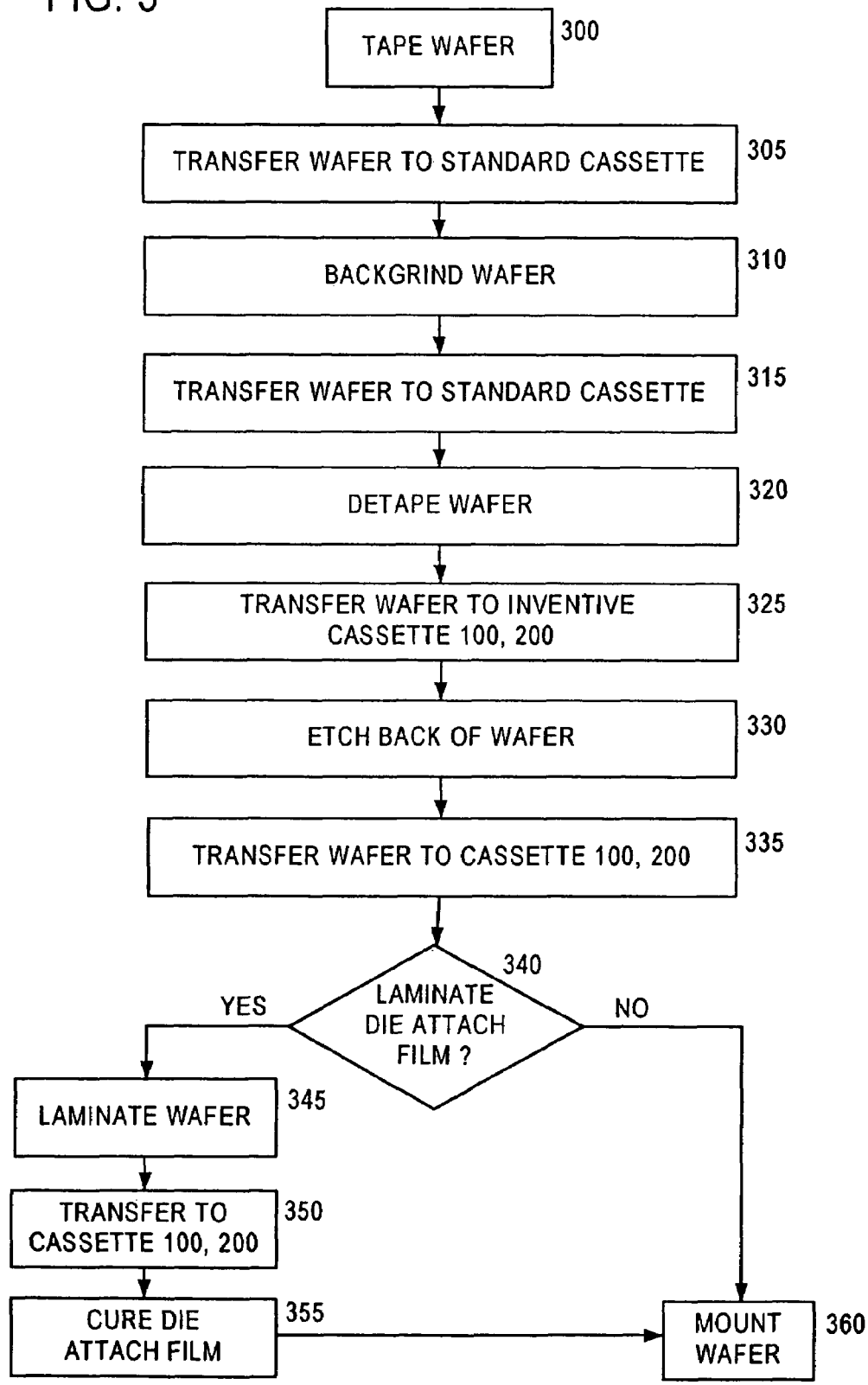
FIG. 3 is a flow chart illustrating sequential phases of a method in accordance with an embodiment of the present invention.

Referring now to FIG. 3, a semiconductor wafer having an initial thickness of about 500 µm to about 700 µm is prepared at step 300 for the thickness reduction process by applying conventional backgrinding tape to its active side (i.e., the side opposite its back side) at a conventional taping machine. After taping, the wafer is transferred at step 305 to a standard wafer cassette, then brought to a conventional backgrinding machine, where the back side of the wafer is ground (step 310) from its initial thickness to an intermediate thickness; e.g., about 150 µm; for example, using a polishing pad having diamond powder in a single grinding operation.

At step 315, the back-ground wafer is transferred again to the standard wafer cassette, then brought to a conventional detaping machine (step 320) to remove the tape. After the tape is removed, the wafer is transferred to one of the inventive wafer cassettes 100, 200 described above with reference to FIGS. 1A–2B, wherein the thinned wafer is supported such that it is substantially planar (step 325). The inventive cassette 100, 200 is used since the thinned wafer typically sags or warps, for the reasons discussed above, making the use of standard wafer cassettes problematical.

The wafer is brought to a conventional etch chamber at step 330, such as a plasma etcher, where the back side of the wafer is plasma etched to reduce the intermediate thickness to a desired final thickness; e.g., about 100 μm or less. After etching to the final thickness, the wafer is transferred back to one of the inventive cassettes 100, 200 at step 335.

At this point, a die attach film may be laminated to the wafer (see step 340), or the wafer may be brought to a conventional wafer mounting apparatus (step 360), where the wafer is removed from the inventive cassette 100, 200 and mounted to a dicing tape. If die attach film is to be laminated to the back of the wafer before mounting the wafer to the dicing tape, the wafer is transferred to a conventional laminator at step 345 for lamination, then transferred back to an inventive cassette 100, 200 at step 350, and then brought to a conventional oven for curing of the die attach film (step 355) before being brought to the wafer mounting machine (step 360) for mounting the wafer to the dicing tape.

The inventive two-step backgrinding/etching process is faster and less expensive than conventional multi-step grinding/polishing processes, because it requires less steps, and each step is accomplished relatively quickly. Moreover, the inventive method employs standard grinding and etching equipment, rather than the expensive dedicated equipment needed to perform prior art wafer thinning techniques.

The present invention is applicable to the manufacture of various types of semiconductor devices, particularly high-density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only exemplary embodiments of the present invention, to show its versatility, are shown and described in the present disclosure. It is to be understood that the present invention is capable of use in various other combinations and environments and is capable of changes or modifications within the scope of the inventive concept as expressed herein.

What is claimed is:

1. A method of reducing the thickness of a semiconductor wafer having an initial thickness, the method comprising:
   grinding a back side of the wafer to reduce the initial thickness to an intermediate thickness;
   transferring the wafer, after the grinding step, to a cassette for supporting the wafer such that the wafer is substantially planar;
   transferring the wafer from the cassette to an etcher for performing a plasma etching step;
   plasma etching the back side of the wafer to reduce the intermediate thickness to a final thickness; and
   transferring the wafer to the cassette after the etching step.

2. The method of claim 1, wherein the initial thickness is from about 500 μm to about 700 μm, the intermediate thickness is about 150 μm, and the final thickness is about 100 μm or less.

3. The method of claim 1, comprising grinding the back side of the wafer using a polishing pad having diamond powder.

4. The method of claim 1, comprising grinding the back side of the wafer to the intermediate thickness in a single grinding operation.

5. A method of reducing the thickness of a semiconductor wafer having an initial thickness, the method comprising:
   grinding a back side of the wafer to reduce the initial thickness to an intermediate thickness,
   transferring the wafer, after the grinding step, to a cassette for supporting the wafer such that the wafer is substantially planar,
   transferring the wafer from the cassette to an etcher for performing a plasma etching step,
   plasma etching the back side of the wafer to reduce the intermediate thickness to a final thickness,
   transferring the wafer to the cassette after the etching step,
   applying a backgrinding tape to an active side of the wafer opposite to the back side of the wafer prior to the grinding step, and
   removing the tape prior to the etching step.

6. A method of reducing the thickness of a semiconductor wafer having an initial thickness, the method comprising:
   grinding a back side of the wafer to reduce the initial thickness to an intermediate thickness;
   transferring the wafer, after the grinding step, to a cassette for supporting the wafer such that the wafer is substantially planar;
   transferring the wafer from the cassette to an etcher for performing a plasma etching step;
   plasma etching the back side of the wafer to reduce the intermediate thickness to a final thickness;
   transferring the wafer to the cassette after the etching step;
   laminating a die attach film to the back side of the wafer after the etching step;
   curing the die attach film; and
   mounting the wafer to a dicing tape.

* * * * *